(12) United States Patent
Bailey

(10) Patent No.: US 10,742,926 B2
(45) Date of Patent: Aug. 11, 2020

(54) NETWORK INTERFACE DEVICE

(71) Applicant: PPC BROADBAND, INC., East Syracuse, NY (US)

(72) Inventor: Paul Bailey, Camillus, NY (US)

(73) Assignee: PPC BROADBAND, INC., East Syracuse, NY (US)

(*) Notice: Subject to any disclaimer, the term of this patent is extended or adjusted under 35 U.S.C. 154(b) by 6 days.

(21) Appl. No.: 16/154,803

(22) Filed: Oct. 9, 2018

(65) Prior Publication Data

US 2019/0110021 A1   Apr. 11, 2019

Related U.S. Application Data

(60) Provisional application No. 62/569,130, filed on Oct. 6, 2017.

(51) Int. Cl.
| | | |
|---|---|---|
| *H04N 7/10* | (2006.01) | |
| *H04N 7/173* | (2011.01) | |
| *H03F 3/191* | (2006.01) | |
| *H03H 7/46* | (2006.01) | |
| *H03F 3/62* | (2006.01) | |
| *H04H 20/78* | (2008.01) | |
| *H04N 21/61* | (2011.01) | |
| *H04N 21/443* | (2011.01) | |

(52) U.S. Cl.
CPC .............. *H04N 7/102* (2013.01); *H03F 3/191* (2013.01); *H03F 3/62* (2013.01); *H03H 7/461* (2013.01); *H04N 7/104* (2013.01); *H04N 7/17309* (2013.01); *H03F 2200/63* (2013.01); *H04H 20/78* (2013.01); *H04N 21/4436* (2013.01); *H04N 21/6118* (2013.01)

(58) Field of Classification Search
CPC .... H04N 7/102; H04N 7/104; H04N 7/17309; H04N 21/4436; H04N 21/6118; H03F 3/191; H03F 3/62; H03F 2200/63; H03H 7/461; H04H 20/78
See application file for complete search history.

(56) References Cited

U.S. PATENT DOCUMENTS

| | | |
|---|---|---|
| 7,912,431 B2 | 3/2011 | Phillips et al. |
| 7,974,586 B2 | 7/2011 | Romerein et al. |
| 8,793,755 B2 | 7/2014 | Montena et al. |
| 2002/0110097 A1* | 8/2002 | Sugirtharaj ........... H04W 28/20 370/329 |

(Continued)

OTHER PUBLICATIONS

Shane Thomas (Authorized Officer), International Search Report and Written Opinion dated Dec. 4, 2018, PCT Application No. PCT/US2018/054917, pp. 1-14.

*Primary Examiner* — Nicholas T Corbo
(74) *Attorney, Agent, or Firm* — MH2 Technology Law Group LLP

(57) ABSTRACT

A network interface device includes an active path between an entry port and a first input/output port. The network interface device also includes a passive path between the entry port and a second input/output port. The network interface device also includes a buffer in the active path configured to absorb, attenuate, terminate, or isolate radio-frequency (RF) signals. The network interface device also includes a switching element in the active path configured to selectively bypass the buffer during normal operating conditions.

30 Claims, 12 Drawing Sheets

(56) References Cited

U.S. PATENT DOCUMENTS

| | | | |
|---|---|---|---|
| 2004/0261121 A1* | 12/2004 | Bishop | G01S 1/00 725/129 |
| 2010/0117728 A1 | 5/2010 | Riggsby | |
| 2013/0133019 A1* | 5/2013 | Montena | H04N 21/61 725/127 |
| 2014/0033264 A1 | 1/2014 | Li et al. | |

* cited by examiner

NETWORK INTERFACE DEVICE

CROSS-REFERENCE TO RELATED APPLICATIONS

This application claims priority to U.S. Provisional Patent Application No. 62/569,130, filed on Oct. 6, 2017, the entirety of which is incorporated by reference herein.

FIELD

The present disclosure is directed to cable television (CATV) network communication devices. More particularly, the present disclosure relates to an entry adapter for a CATV network.

BACKGROUND

CATV networks supply and distribute high frequency "downstream" signals from a main signal distribution facility, known as a "headend," to premises (e.g., homes and offices) of subscribers of the CATV networks. The downstream signals can be provided to subscriber equipment, such as televisions, telephones, and computers. In addition, most CATV networks also receive "upstream" signals from subscriber equipment back to the headend of the CATV network. For example, a set top box can use an upstream signal to send information for selecting programs for viewing on a television. Also, upstream and downstream signals can be used by personal computers connected through the CATV infrastructure to the Internet. Further, voice over Internet protocol (VOIP) telephones can use upstream and downstream signals to communicate telephone conversations.

To permit simultaneous communication of upstream and downstream signals, and to permit interoperability of the subscriber equipment and the equipment associated with the CATV network infrastructure, the downstream and upstream signals are confined to two different frequency bands. For example, in CATV networks, the downstream frequency band can be within the range of about 54 to 1002 megahertz (MHz) and the upstream frequency band can be within the range of about 5 to 42 MHz.

Downstream signals can be delivered from the infrastructure of the CATV network to the subscriber premises via a network interface device (a.k.a., an entry device, an entry adapter, a terminal adapter, or a drop amplifier). A network interface device can be a multi-port device, in which an upstream entry port connects to a drop cable from the infrastructure of the CATV network, and one or more input/output ports (hereinafter "ports") connect to subscriber equipment distributed around a premises of a subscriber.

The network interface device can include two paths: an active RF signal communication path (i.e., "active path") and a passive RF signal communication path (i.e., passive path"). The active path can include active components (e.g., powered devices) that amplify and/or condition downstream signals received from the CATV infrastructure and conduct them to one or more ports of the CATV entry adapter. Subscriber equipment connected to these active ports benefits from this amplification of the CATV downstream signal. However, loss of power to the entry adapter prevents communication of active CATV signals by the active components. In comparison, the passive path lacks any active components. As such, subscriber equipment connected to these passive path can operate in the event of power loss. For example, the passive path may be used to provide a "lifeline telephone service" that remains operative when a subscriber premises losses power.

SUMMARY

A network interface device may include a power supply. The network interface device may also include an entry port configured to connect the network interface device to a radio-frequency (RF) signal source. The network interface device may also include a passive port configured to connect the network interface device to a first client device. The network interface device may also include an active port configured to connect the network interface device to a second client device. The network interface device may also include a passive RF signal path coupling the entry port to the passive port. The network interface device may also include an active RF signal path coupling the entry port to the active port and comprising a first relay, a buffer, and a second relay. The network interface device may also include a splitter/combiner device configured to split a downstream RF signal received by the entry port from the RF signal source between the active RF signal path and the passive RF signal path. The first relay and the second relay, when energized by the power supply, are configured to direct an upstream RF signal received by the active port and the downstream RF signal to bypass the buffer. The first relay and the second relay, when not energized by the power source, are configured to direct the upstream RF signal and the downstream RF signal through the buffer.

In another embodiment, the network interface may include an entry port configured communicate a downstream radio-frequency (RF) signal received from a signal source to an active path of the network interface device and to a passive path of the network interface device. The network interface device may also include a first port configured to communicate a first upstream RF signal to the entry port via the passive path. The network interface device may also include a second port configured to communicate a second upstream RF signal to the entry port via the active path. The network interface device may also include a buffer having a first state and a second state. The buffer may be configured to, in the first state, pass the second upstream RF signal and the downstream RF signal between the entry port and the second port via the active path, and, in the second state, prevent passage of the second upstream RF signal and the downstream RF signal between the entry port and the second port, and absorb, attenuate, terminate, or isolate the downstream RF signal and the second upstream RF signal.

In yet another embodiment, the network interface device may include an active path between an entry port and a first input/output port. The network interface device may also include a passive path between the entry port and a second input/output port. The network interface device may also include a buffer in the active path configured to absorb, attenuate, terminate, or isolate radio-frequency (RF) signals. The network interface device may also include a switching element in the active path configured to selectively bypass the buffer during normal operating conditions.

Other and different statements and aspects of the invention appear in the following claims. A more complete appreciation of the present invention, as well as the manner in which the present invention achieves the above and other improvements, can be obtained by reference to the following detailed description of a presently preferred embodiment

DETAILED DESCRIPTION

A network interface device in accordance with aspects of the present disclosure preserves signal quality in a passive path (e.g., a low-loss VOIP path) in the event of power loss or other fault that interrupts power supplied to an active path. In some implementations, the network interface device isolates the passive path to minimize interference (e.g., distorted and/or reflected signals) from the active path. For example, in response to power loss or other fault, the network interface device can increase isolation of the active path from the passive path by automatically placing a resistive attenuator or absorptive filter between the passive path and the active path.

Figure 1:
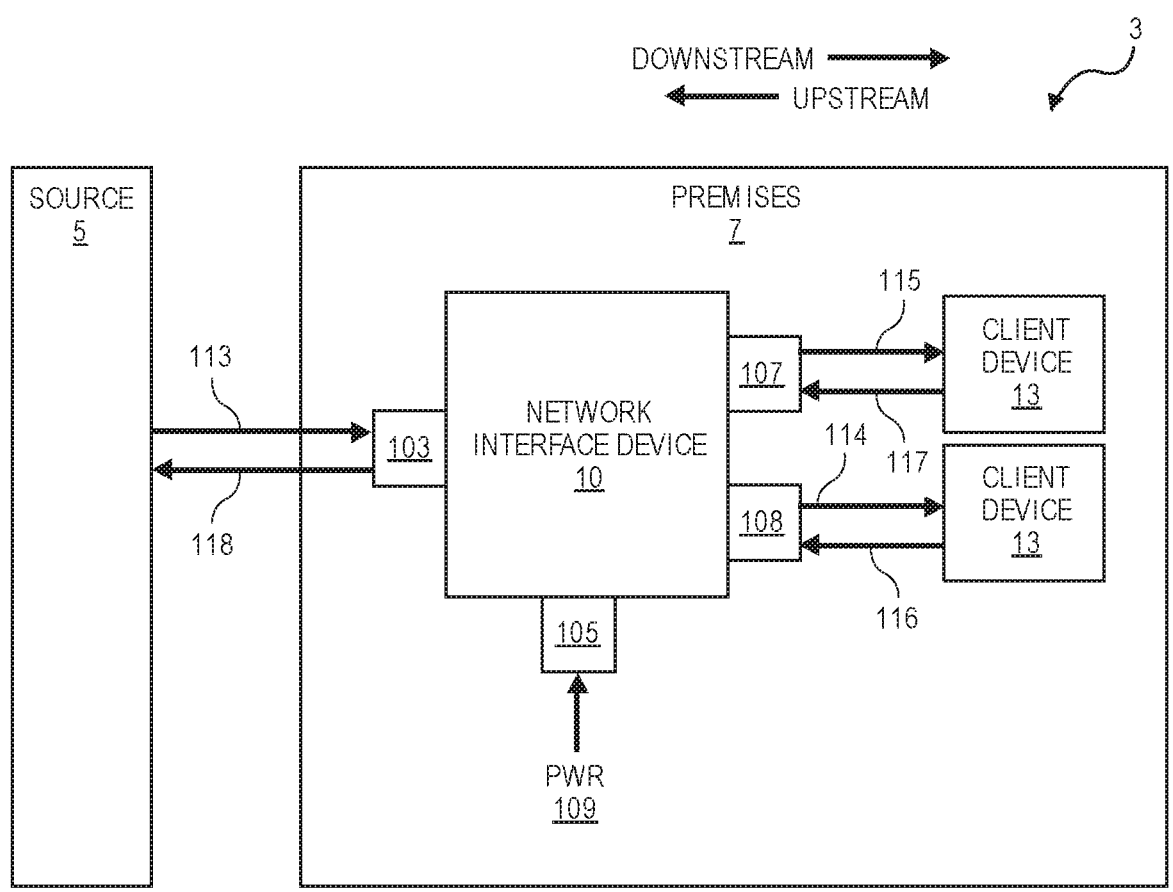
FIG. 1 is a functional block diagram of an example of an environment for implementing systems, devices, and processes in accordance with aspects of the present disclosure. In other embodiments, the network interface device (NID) may be placed external to the premises.

FIG. 1 illustrates a block diagram of an example of an environment 3 for implementing systems, devices, and processes in accordance with aspects of the present disclosure.

The environment 3 can include a source 5, and a premises 7. The source 5 can be a network of an information service, such as a CATV network. In some implementations, the premises 7 can be a location of a client of the source 5, such as a subscriber of the CATV network. For example, the premises 7 can be a residence, an office, a business, and the like. In accordance with aspects of the present disclosure, the premises 7 can include a network interface device 10 communicatively connecting client devices 13 and 15 at the premises 7 to the source 5. The client devices 13 and 15 can be, for example, CATV devices, Internet devices, VoIP devices, and/or data communication devices installed in the premises 7. Optionally, the NID may be installed external to the premises while still establishing the same interconnectivity between the cable network and the premises equipment In some implementations, the network interface device 10 includes an entry port 103, an optional power input port 105, optional remote power connectivity through a choke to active port 108, a passive port 107, and an active port 108 that make external connections for communicating radio frequency (RF) signals 113-118 and power 109. The passive port 107 and the active port 108 can be input/output ports electrically coupled to the client devices 13 and 15, and can communicate RF signals 115-118 between the network interface device 10 and the client devices 13 and 15. The entry port 103 can be an input/output port electrically coupled (directly or indirectly) to the source 5 (e.g., via a drop line from a network), and can receive downstream RF signals 113 from the source 5. The entry port 103 can also transmit upstream RF signals 118 from the client devices 13 and 15 to the source 5. The power input port 105 can be an input port that receives the power (PWR) 109 from an external power source (not shown) that powers components of the network interface device 10. Alternatively, the remote power connected to the active port 108 can be an input port that receives the power (PWR) 109 from an external power source (not shown) that powers components of the network interface device 10.

Figure 2A:
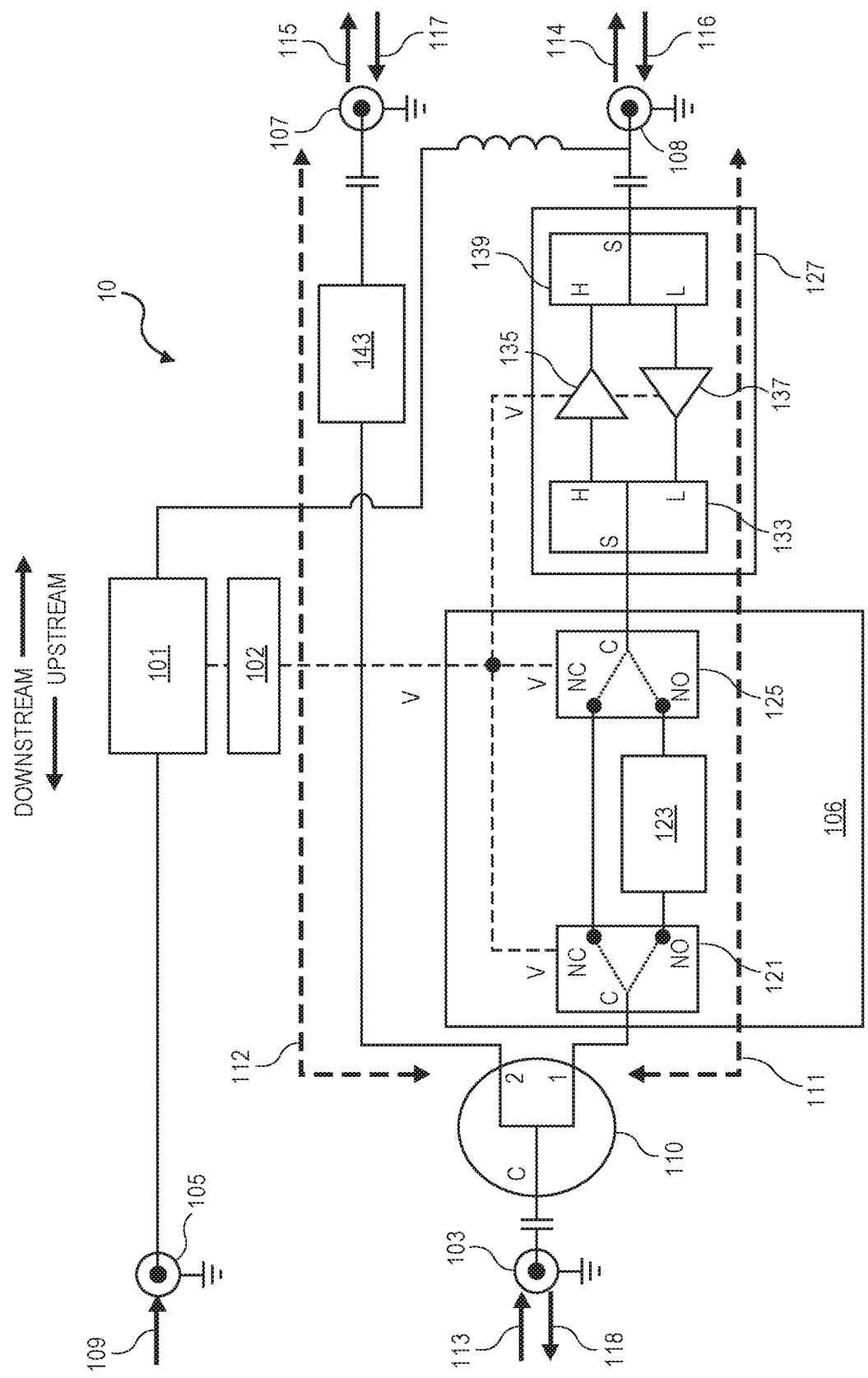
FIG. 2A is a functional block diagram of an example of a network interface device in accordance with aspects of the present disclosure.
Figure 2B:
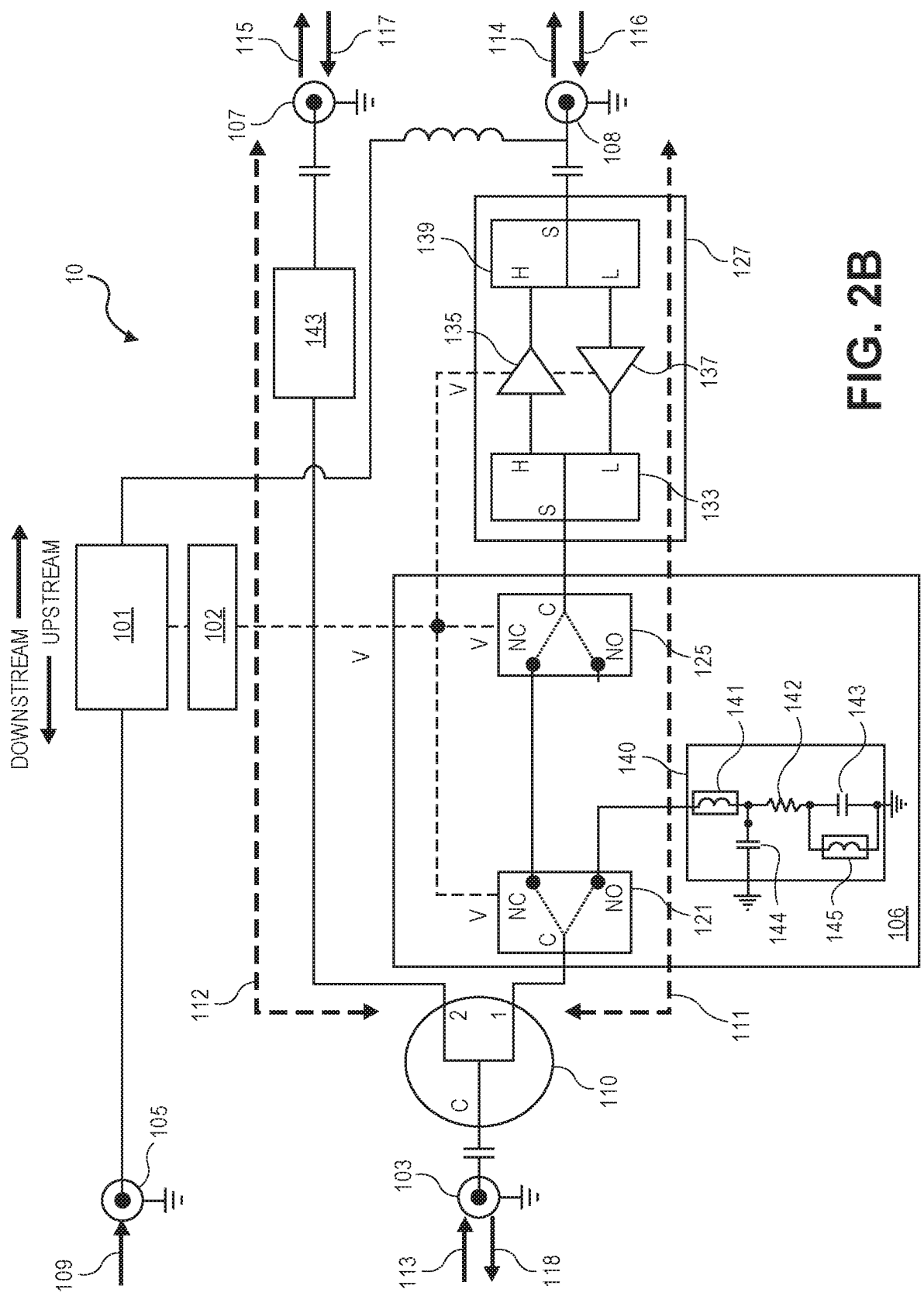
FIG. 2B is a functional block diagram of another example of a network interface device in accordance with aspects of the present disclosure.

FIGS. 2A and 2B are functional block diagrams of an exemplary network interface device 10 in accordance with aspects of the present disclosure. The network interface device 10 can include a regulator 101 and a fault detector 102. The network interface device 10 can also include an entry port 103, a power input port 105, a passive port 107, and an active port 108, which can be the same or similar to those previously described herein. Additionally, the network interface device 10 can include a splitter/combiner 110, an active path 111 (indicated by a first dashed line) and a passive path 112 (indicated by a second dashed line).

The regulator 101 can be a power device that receives power 109 from the power input port 105 and outputs a voltage V (e.g., 10 VDC, 9 VDC, and/or 5 VDC) for driving active devices, relays, transistors, and other powered devices of the network interface device 10. The fault detector 102 can be a power device connected to an output of the regulator 101 that selectively interrupts power output by the regulator 101 to the components of the network interface device 10 under a fault condition. The fault condition can be, for example, a power surge, a power fluctuation, or a power drop sensed by the fault detector 102.

The splitter/combiner 110 is a passive device having a common terminal (C) electrically coupled to the input port 103, a first leg (1) electrically coupled to the active path 111, and a second leg (2) electrically coupled to the passive path 112. For example, the splitter/combiner 119 can be a one-in, two-out splitter device. In some implementations, the splitter/combiner 110 provides high isolation (e.g., 25 decibels (dB)) between its legs (1, 2) to minimize leakage of RF signals (e.g., upstream RF signals 116 and 117) between the active path 111 and the passive path 112.

The splitter/combiner 110 can communicate bidirectional RF signals 113-118 between the entry port 103 and the passive port 107, and between the entry port 103 and the active port 108. In the downstream direction, the splitter/combiner 110 splits a downstream RF signal 113 received from a source (e.g., the source 5 shown in FIG. 1, such as a CATV headend) into a downstream RF signal 114, which is communicated to the active port 108 via the active path 111, and into a downstream RF signal 115, which is communicated to the passive port 107 via the passive path 112. In the upstream direction, the splitter/combiner 110 combines an upstream RF signal 116 from a device (e.g., the client device 15 (FIG. 1), such as a set top box) with an upstream RF signal 117 from a device (e.g., the client device 13 (FIG. 1)) to provide an upstream RF signal 118 to the source via the entry port 103. In some implementations, the splitter/combiner 110 can equally split the downstream RF signal 113 received at the common terminal (C) between the legs (1, 2). In other implementations, the splitter/combiner 110 can split the downstream RF signal 113 into non-equal portions. For example, the splitter/combiner 110 can be a directional coupler that provides a majority (e.g., >50%) of the downstream RF signal 113 to the second leg (2), which feeds the passive path 112.

The active path 111 communicatively links bidirectional RF signals 113, 114, 116, 118 between the entry port 103 and the active port 108. The active path 111 includes at least one active device (e.g., amplifiers 135 and 137) powered by a power source (e.g., power 109 from the power input port 105 provided via the regulator 151). In some implementations, the active path 111 includes the first leg (1) of the splitter/combiner 110 and a device 106 which includes: a switch 121, a buffer 123, a second switch 125, and an amplifier circuit 127. As used herein, a buffer may also be referred to as an attenuator/isolator and may be used to buffer, attenuate, and/or isolate signals.

In some implementations, the device 106 can include a first switch 121, buffer 123, and a second switch 125. The switches 121 and 125 provide a switching element (also referred to as a switching circuit) that bypasses the buffer 123 as described herein. The switches 121 and 125 can be relays having a common terminal (C), a normally-closed (NC) terminal and a normally-open (NO) terminal. For example, as illustrated in FIG. 2, the switches 121 and 125 can be single-pole, dual-throw (SPDT) non-latching relays. However, it understood that other types of relays can be implemented (e.g., dual-poll, dual terminal relays). In some implementations, the switches 121 and 125 can be mechanical relays. In other implementations, the switches 121 and 125 can be solid-state relays. The common terminal (C) is electrically connected to the normally-closed terminal (NC) when the switches 121 and 125 are not powered. On the other hand, the common terminal (C) is electrically connected to the normally-open (NO) terminal when the switches 121 and 125 are powered. For example, when energized with an operating voltage provided from the power input port 105 via, e.g., a regulator 143, the switches 121 and 125 are placed in a first state in which the common terminal (C) connects to the normally-open terminal (NO). When the switching element is not energized, the common terminal (C) connects to the normally-closed terminal (NC). Thus, the common terminal (C) of each of the switches 121 and 125 connects to the normally-closed terminals (NC) if the network interface device 10 loses power 109, if the regulator 151 fails, or if the fault detector 153 interrupts the power 109 in response to a fault condition.

The buffer 123 can be electrically connected between the normally-open terminals of the switches 121 and 125 such that the buffer 123 is included in the active path 111 in the event that the switches 121 and 125 are not energized. The buffer 123 can be configured to increase the isolation of the active path 111 from the passive path 112 by automatically placing a resistive attenuator or absorptive filter between the active path 111 and the passive path 112. In embodiments, the buffer 123 attenuates upstream and/or downstream RF signals best at levels greater than 10 dB.

The amplifier circuit 127 can include one or more active components capable of electrically controlling electron flow (i.e., current). In some implementations, the amplifier circuit 127 can include a first diplexer 133, a downstream amplifier 135, upstream amplifier 137, and a second diplexer 139. The diplexers 133 and 139 can be passive devices that separate RF signals received at a common terminal (S) into a high frequency band and a low frequency band. The high frequency band signal is output from the high terminal (H) and the low frequency band signals are output from the low terminal (L). In the reverse direction, the diplexers 133 and 139 multiplex signals received at the high terminal (H) and the low terminal (L) into a single signal, which is output from the common terminal (C). In some implementations, the diplexers 133 and 139 filter RF signals such that frequencies greater than about 54 MHz (e.g., a CATV downstream frequency band) are passed bidirectionally between the common terminal (C) to the high terminal (H), and frequencies less than about 42 MHz (e.g., a CATV upstream frequency band) are passed bidirectionally between the common terminal (C) to the low terminal (L).

The passive path 112 is a signal path through the network interface device 10 that is entirely devoid of any active devices. The passive path 112 communicatively links bidirectional RF signals (e.g., RF signals 115 and 117) between the entry port 103 and the passive port 107. The passive path 112 can include the second leg (2) of the splitter/combiner 119, which can transmit bidirectional RF signals 113, 115, 117, and 118 between the entry port 103 and the passive port 107. Additionally, in some implementations, the passive path 112 can include an un-powered passive device 143, made up of solely of non-active devices, such as resistors, capacitors, inductors, transformers, and/or diodes. For example, the passive device 143 can include one or more passive filters or attenuators for conditioning RF signals 114 and 116.

During normal operation of the network interface device 10, the various powered devices (e.g., switches 121 and 125) or active components (e.g., amplifiers 135 and 137) contained therein are powered via power 109 received via the power input port 105. Accordingly, the switches 121 and 125 communicate the RF signals 114 and 116 through the active path 111 via the amplifier circuit 127, bypassing the buffer 123. In the event of a condition that interrupts the power 109 and/or voltage V, the switches 121 and 125 switch the active path 111 through the normally-open terminals (NO), which direct the RF signals 114 and 116 through the buffer 123. As such, the RF signals 114 and 116 are substantially attenuated or terminated by the buffer 123 such that the downstream RF signal 114 is not reflected back to the splitter/combiner 110 (or at least such reflections are attenuated), and the upstream RF signal 116 is not communicated to the splitter/combiner 110. Interference from noise and reflections from the RF signals 114 and 116 into the entry port 103 and the passive port 107 from the active path 111 during a fault condition are, thereby, minimized. Accordingly, during power loss or a fault condition, the network interface device 10 minimizes or eliminates signal interference in the passive path 112 from the active path 111 so that a device (e.g., a passive client device 13 (FIG. 1), such as a VOIP device) connected to the passive port 107 can continue to communicate via the entry port 103 with little or no effects of interference from the active path 111.

In FIG. 2B, a shunt buffer 140 may be connected to the switch 121. The shunt buffer 140 may not be connected to the switch 125. When the shunt buffer 140 is in use, the buffer 123 and/or the switch 125 may be omitted. All or a portion of the shunt buffer 140 may be or include an attenuator, a resistor, absorptive ferrite, an absorptive low-pass filter, high-pass or a band-pass filter, and/or a phase-cancellation circuit. Examples may be seen in FIGS. 3A, 3B, 4-6, and 9B.

The shunt buffer 140 may include a first inductor 141, a resistor 142, and a first capacitor 143 in series. A second capacitor 144 may be connected between the first inductor 141 and the resistor 142. The second capacitor 144 may be grounded. A second inductor 145 may be connected in parallel with the first capacitor 143. The first capacitor 143 and the second inductor 145 may also be connected to ground. As will be appreciated, the buffers 123, 140 are merely illustrative, and any attenuator may be used. For example, in one embodiment, the buffer 123 may be in a shunt configuration, and all of the internal circuit elements thereof may also be as effective in the shunt configuration. Additionally, the buffer 140 may be in a series configuration, and all of the internal circuit elements thereof may also be as effective in the series configuration. Another embodiment of the series buffer 140 is shown in FIG. 9C.

Figure 3A:
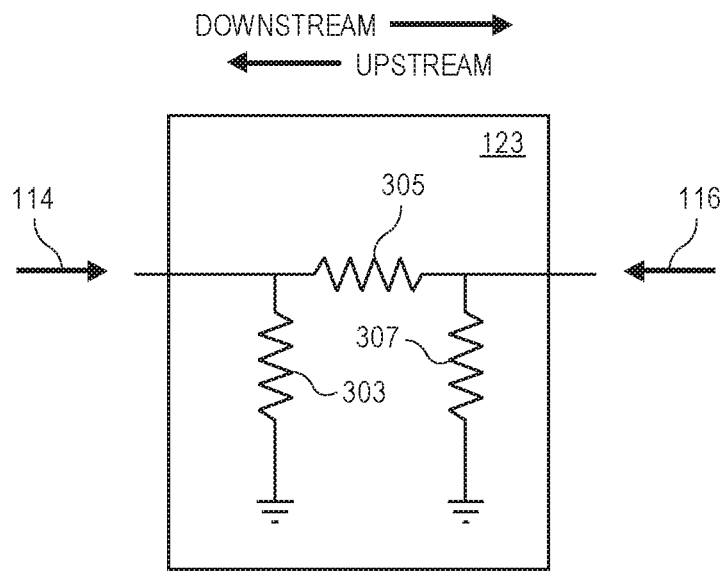
FIG. 3A is a functional block diagram of an example of a resistive buffer in accordance with aspects of the present disclosure.

FIG. 3A is a functional block diagram of a buffer 123 in accordance with some implementations consistent with the present disclosure. The buffer 123 can be a passive device including resistive elements that attenuate RF signals 114 and 116. In some implementations, the buffer 123 can include resistors 303, 305, and 307. The resistor 305 can be positioned in series with the RF signals 114 and 116. The resistor 303 can have a first end connected to an upstream end of resistor 305 and a second end connected to the circuit common or ground. The resistor 307 can be parallel to the resistor 303. For example, a first end of the resistor 307 can be connected to a downstream end of resistor 305, and a second end of the resistor 307 connected to the circuit common or ground. In some implementations, resistors 303, 305, and 307 of the buffer 123 attenuate the power of RF signal 116 by 10 dB and attenuate the power of reflected RF signal 114 by 20 decibels (dB).

Figure 3B:
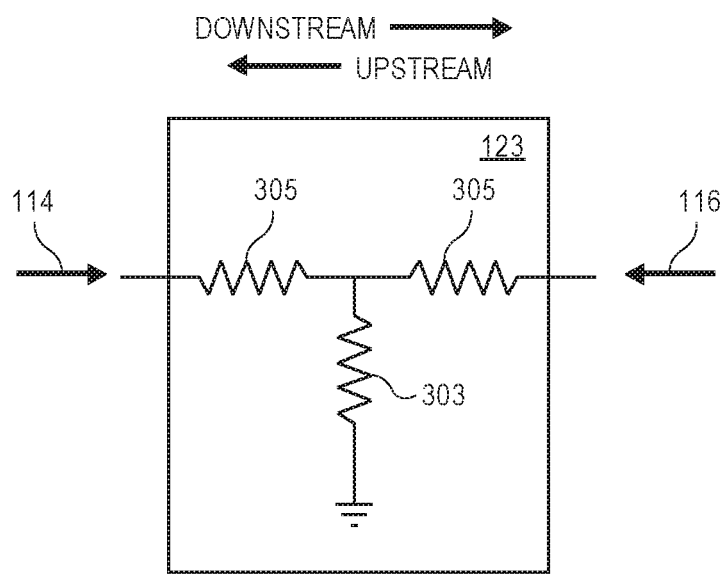
FIG. 3B is a functional block diagram of another example of a resistive buffer in accordance with aspects of the present disclosure.

FIG. 3B is a functional block diagram of a resistive buffer 123 in accordance some implementations consistent with the present disclosure. The buffer 123 can include resistors 303 and 305, which can be the same or similar to those described above. The resistors 305 can be positioned in series. The resistor 303 can have a first end connected to an upstream end of resistor 305 and a second end connected to the circuit common or ground. In some implementations, resistors 303, 305 of the buffer 123 attenuate the power of RF signal 116 by 10 dB and attenuate the power of reflected RF signal 114 by 20 dB.

Figure 4:
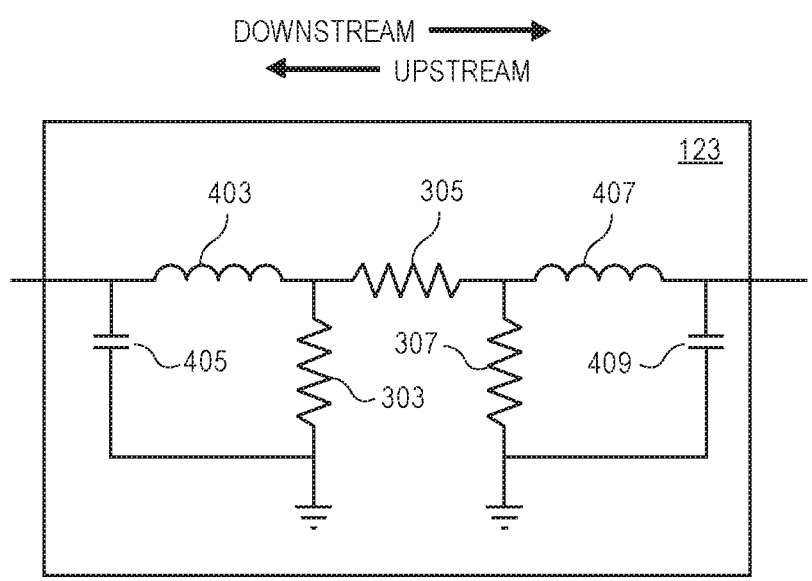
FIG. 4 is a functional block diagram of an example of a matched resistive buffer in accordance with aspects of the present disclosure.

FIG. 4 is a functional block diagram of a matched resistive buffer 123 in accordance with aspects of the present disclosure. The buffer 123 can include resistors 303, 305, and 307, which can be the same or similar to those described above. Additionally, the buffer 123 can include reactive matching elements 403, 405, 407, and 409 to better match the impendence of the signal path carrying the RF signals 114 and 116 (e.g., the active path 111) than a similar circuit lacking such elements. The matching elements 403 and 407 can be inductive elements having inductances in the range of about 3 nanohenries (nH) or less. The matching elements 405 and 409 can be capacitive elements having capacitances in a range of about 0.5 pF or less.

Figure 5:
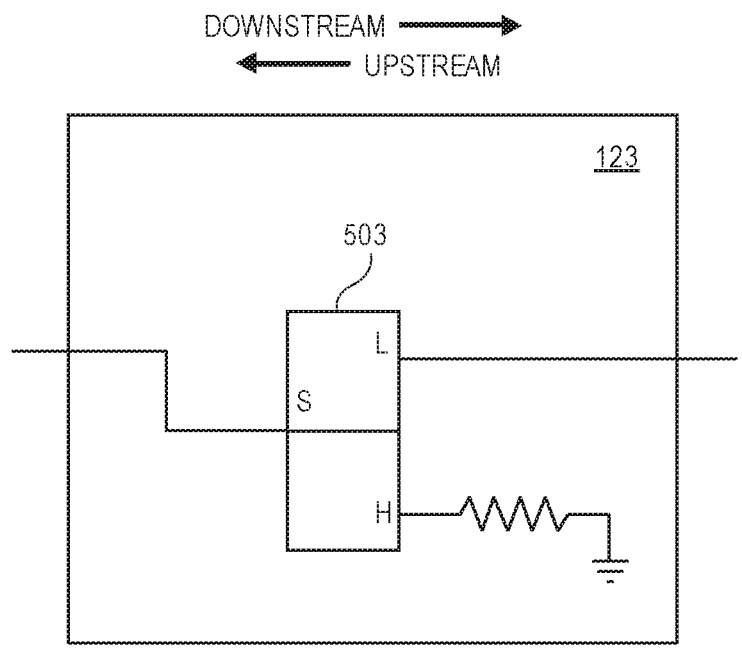
FIG. 5 is a functional block diagram of an example of an absorptive low-pass filter buffer in accordance with aspects of the present disclosure.

FIG. 5 is a functional block diagram of an absorptive low pass filter buffer 123 in accordance with aspects of the present disclosure. The buffer 123 can be a passive device including an absorptive high-pass filter 503 that absorbs frequencies greater than a predetermined value. In some implementations, the high-pass filter 503 filters the entire CATV band. For example, the high-pass filter 503 can filter and/or absorb frequencies less than or equal to about 1002 MHz.

Figure 6:
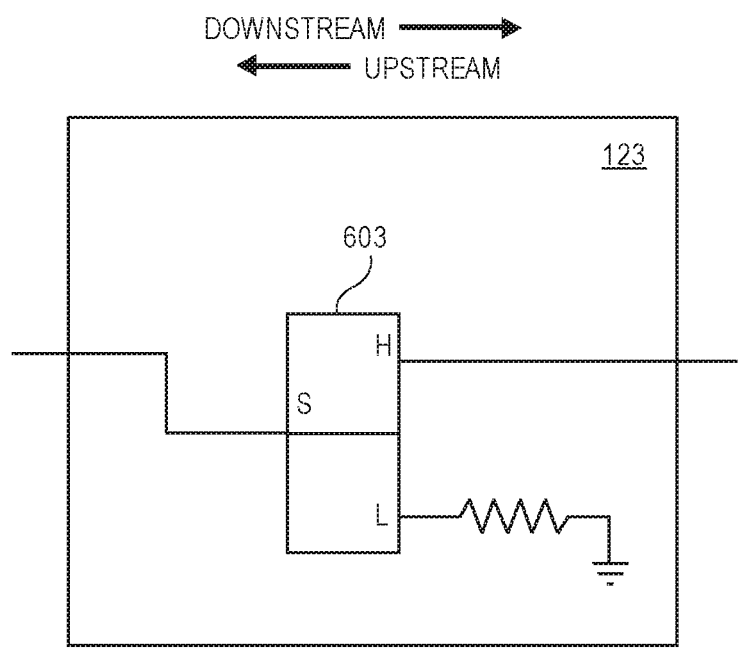
FIG. 6 is a functional block diagram of an example of an absorptive high-pass filter buffer in accordance with aspects of the present disclosure.

FIG. 6 is a functional block diagram of an absorptive high pass filter buffer 123 in accordance with aspects of the present disclosure. The buffer 123 can be a passive device including an absorptive low-pass filter 603 that absorbs frequencies less than predetermined value. In some implementations, the low-pass filter 603 filters the entire CATV band. For example, the low-pass filter 603 can filter and absorb frequencies greater than or equal to about 5 MHz.

Figure 7A:
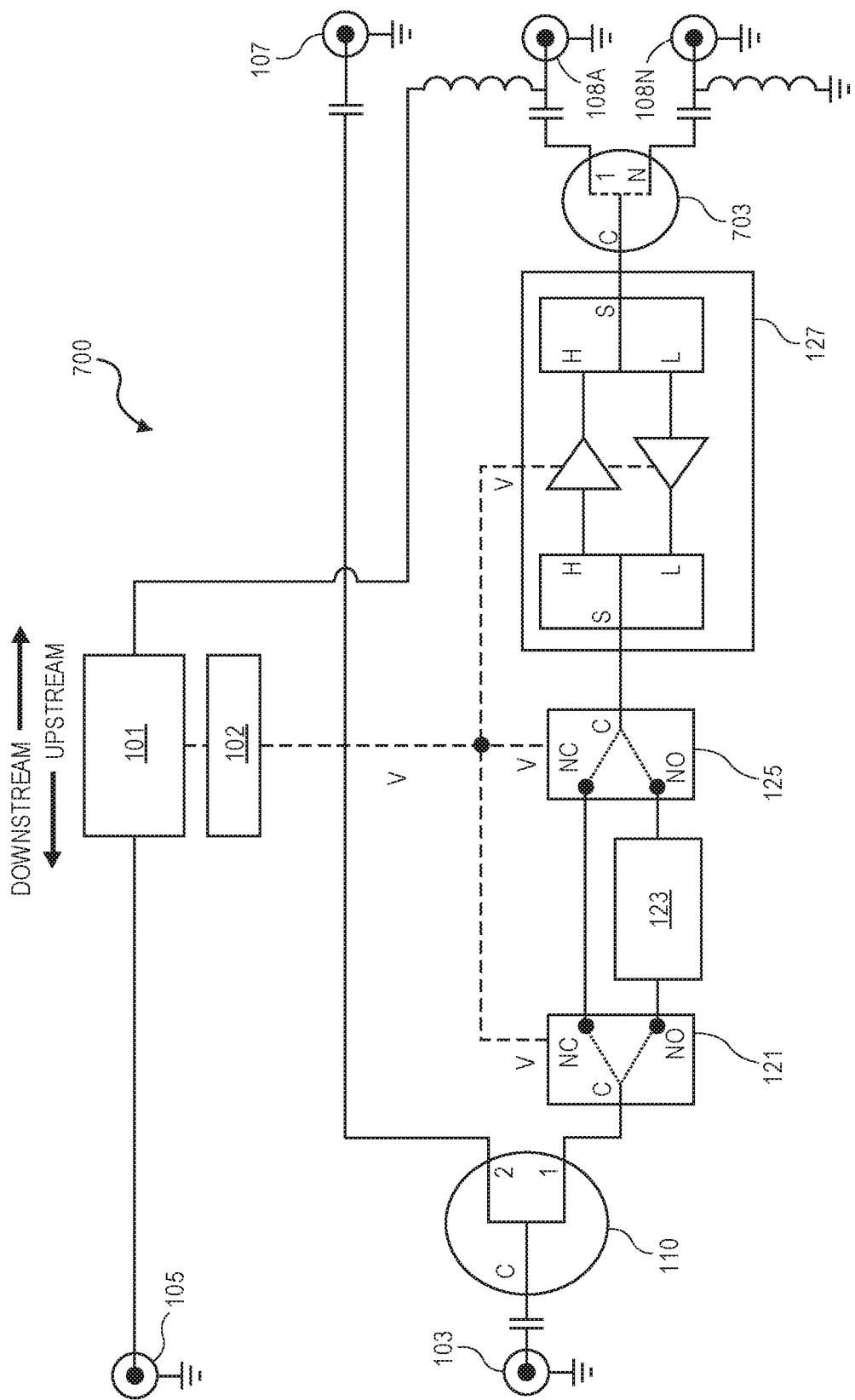
FIG. 7A is a functional block diagram of an example of a multi-output network interface device in accordance with aspects of the present disclosure.
Figure 7B:
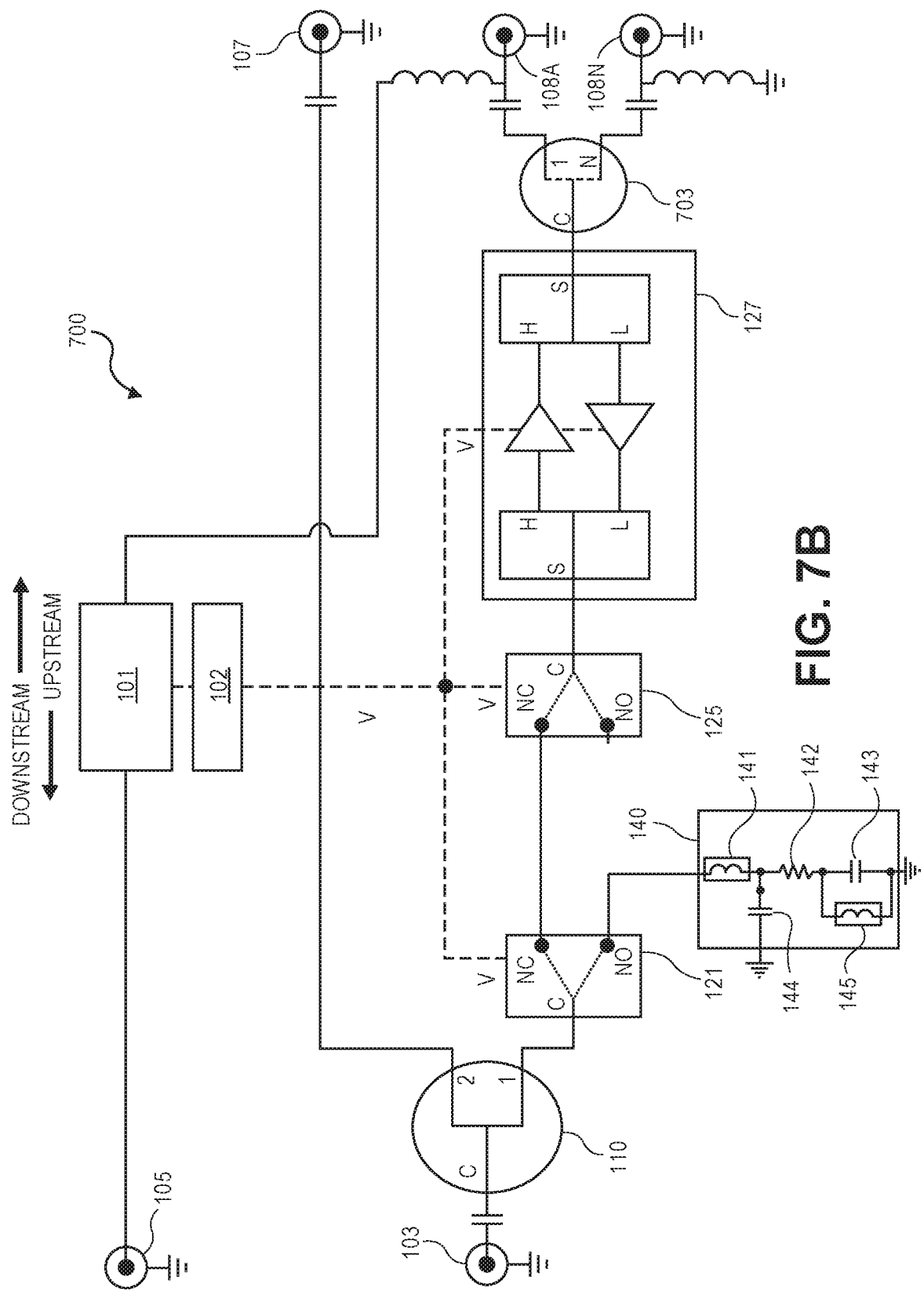
FIG. 7B is a functional block diagram of another example of a multi-output network interface device in accordance with aspects of the present disclosure.

FIGS. 7A and 7B are functional block diagrams of a multi-output network interface device 700 in accordance with aspects of the present disclosure. The network interface device 700 can include an entry port 103, a power input port 105, a passive port 107, active ports 108A . . . 108N, a splitter/combiner 110, a first switch 121, a buffer 123, a second switch 125, and an amplifier circuit 127, which can be the same or similar to those previously described herein. Additionally, the network interface device 700 can include a one-in, multiple-out splitter/combiner 703 electrically connected between the amplifier circuit 127 and the active output 109. More specifically, the splitter/combiner 703 can include a number (N) of outputs, one or more of which can be electrically coupled to respective active ports 108A . . . 108N for communicating RF signals (e.g., RF signals 114 and 116) to respective client devices (e.g., client device 15 (FIG. 1)). Accordingly, the network interface device 700 can communicate with a number (N) of subscriber equipment devices.

In FIG. 7B, the series buffer 140 may be connected to the switch 121. The series buffer 140 may not be connected to the switch 125. When the series buffer 140 is in use, the buffer 123 and/or the switch 125 may be omitted. All or a portion of the series buffer 140 may be or include an attenuator, a resistor, absorptive ferrite, an absorptive low-pass filter, high pass filter, band-pass filter, and/or a phase-cancellation circuit. In at least one embodiment, the series buffer 140 may be equivalent to the buffer 123, with the difference being that one is in series between relays and the other is shunted after the relay 121 or between the relays.

Figure 8:
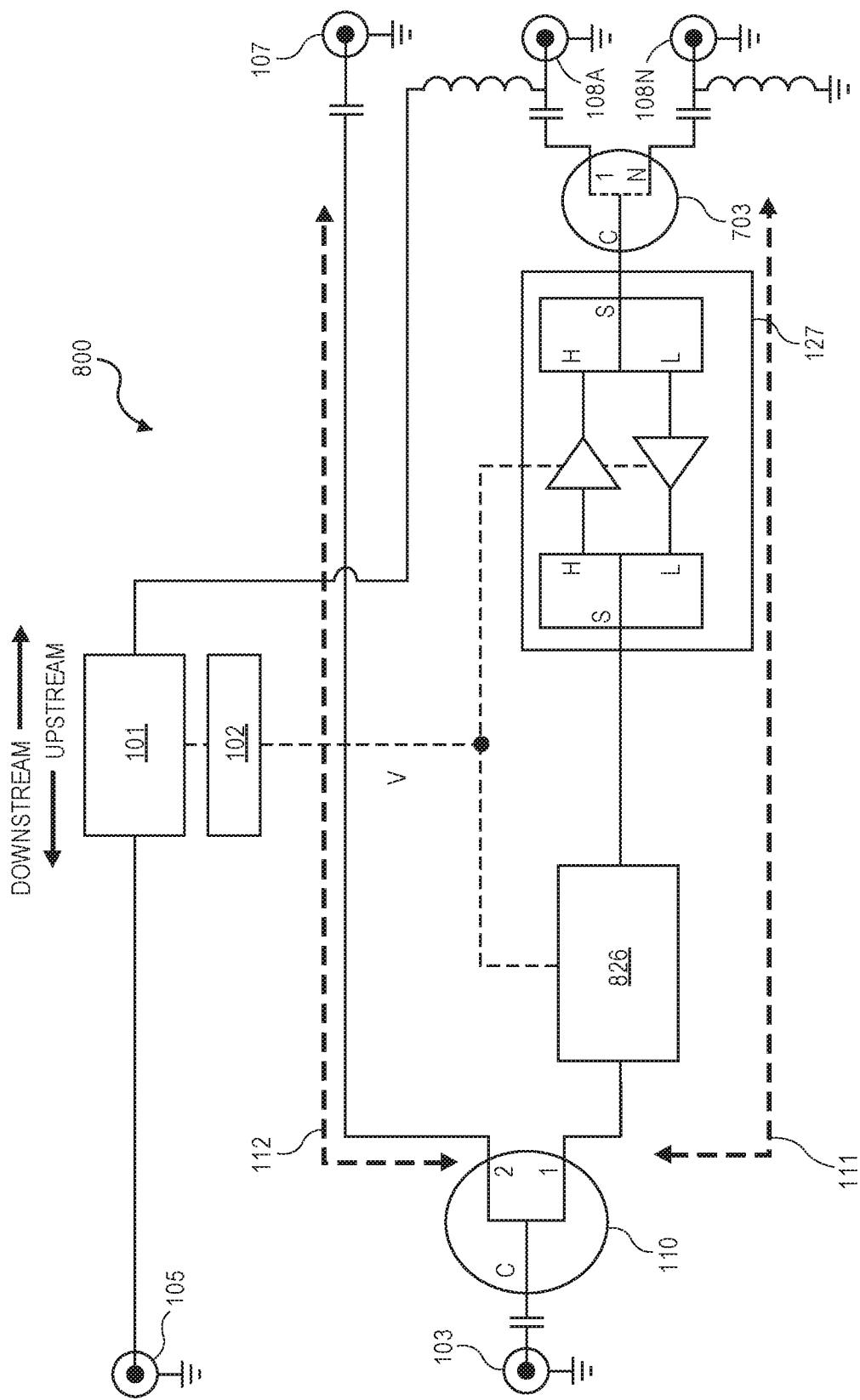
FIG. 8 is a functional block diagram of an example of a multi-output network interface device in accordance with aspects of the present disclosure.

FIG. 8 is a functional block diagram of an example of a multi-output network interface device 800 in accordance with aspects of the present disclosure. The network interface device 800 can include an entry port 103, a power input port 105, a passive port 107, active ports 108A . . . 108N, a splitter/combiner 110, active path 111, passive path 112, and a splitter/combiner 703, all of which can be the same or similar to those previously described herein. Additionally, the network interface device 800 can include a buffer 826 that provides a similar functionality to the attenuation/isolation (e.g., device 106) previously described herein. In some implementations, the buffer 826 can be an active, solid state device that can selectively pass RF signals 114, 116 through the active path 111 when the buffer 826 is in a first state (e.g., energized or powered). And, the buffer 826 can isolate and/or absorb, attenuate, terminate, or isolate RF signals 114, 116 and any reflected signals when the buffer 826 is in a second state (e.g., de-energized or unpowered). For example, the second state can occur due to a loss of power or a power fault condition that de-energizes the buffer 826. In such state, the buffer 826 minimizes or eliminates signal interference in the passive path 112 from the RF signals 114, 116 of the active path 111 so that a device (e.g., a passive client device 13) connected to the passive port 107 can continue to communicate via the entry port 103 with little or no interference from RF signals 114, 116 of the active path 111.

Figure 9A:
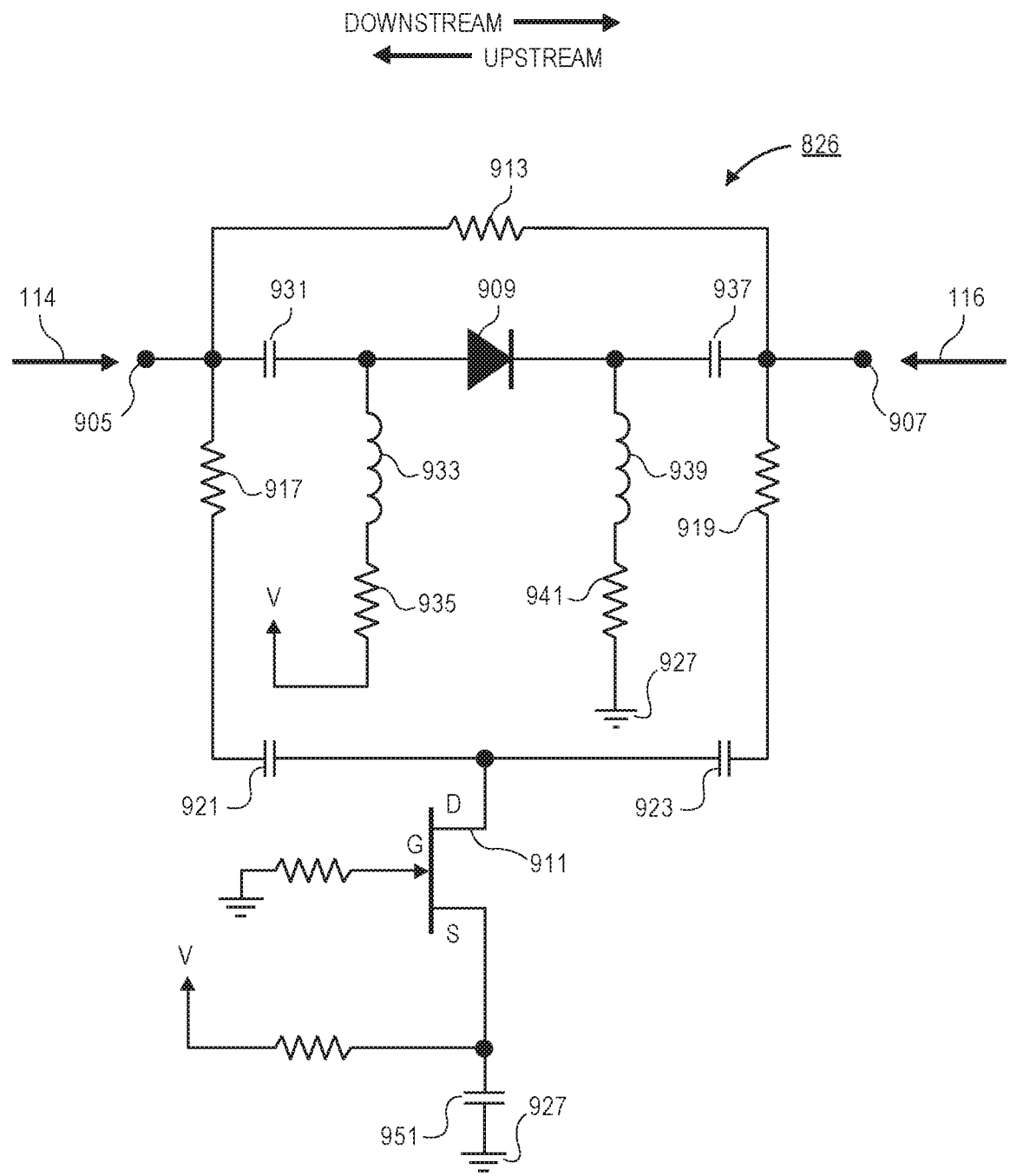
FIG. 9A is a functional block diagram of an example of a buffer in accordance with aspects of the present disclosure.

FIG. 9A is a functional block diagram of an example of the buffer 826 in accordance with aspects of the present disclosure. The buffer 826 includes a signal path that conducts RF signals 114 and 116 between nodes 905 and 907 via a diode 909, and an attenuator including a transistor 911. In some implementations, the buffer 826 can be a solid-state device that lacks any mechanical switches (e.g., switches 121 and 125).

As described above, the buffer 826 can have two states: a first state that exists when buffer 826 is energized by a voltage source V (e.g., from power input port 105 and/or regulator 101), and a second state that exists when the buffer 826 is de-energized (e.g., by a loss of power out to/from regulator 101 or power input port 105, or cutoff of power by fault detector 102). When the buffer 826 is energized in the first state, the buffer 826 can bidirectionally communicate RF signals 114 and 116, in a similar manner to the buffers previously described herein. In the second state, when the buffer 826 is de-energized, the buffer 826 prevents bidirectional communication of the RF signals 114 and 116, and instead, provides isolation and impedance matching to prevent signal reflections in a similar manner to the buffers previously described herein.

The flow of RF signals 114, 116 through the buffer 826 is controlled by the operating states of the diode 909 and the transistor 911, which are determined by whether the voltage source V is energized, as in the first state, or de-energized, as in the second state. In the first state, the voltage source V connected to the source (S) of the transistor 911 biases it to prevent flow of current between its drain D and source S. For example, as illustrated in FIG. 9, the transistor 911 can be an n-channel field-effect transistor (e.g., an n-channel JFET or MOSFET) having its gate (G) tied to ground and its source tied to the voltage source V. Thus, in the first state, the power source V reverse-biases the transistor 911 such that it is in an off-state, and current does not flow through the transistor 911 between its drain D and source S. Additionally, in the first state, the voltage source V connected to the input of the diode 909 forward biases the diode 909, which provides a low-loss (e.g., about 0 dB loss) signal path for RF signals 114 and 116 between the nodes 905 and 907 through the diode 909. As such, the RF signals 114 and 116 do not flow through resistors 913, 917, 919 or capacitors 921, 923 due to their high resistance in comparison to the path via the diode 909. Accordingly, in the first state, the RF signals 114, 116 flow through the buffer 826 solely between nodes 905 and 907 via the diode 909.

In the second state, when the voltage source V is de-energized (e.g., V is about zero volts), the transistor 911 is unbiased to permit current flow through its resistive structure, and the diode 909 is not forward-biased and thus blocks current flow via its open or high impedance structure. For example, where the transistor 911 is an N-channel JFET, above, the lack of voltage from the power source V (e.g., PWR 109, regulator 101 and/or fault detector 102) un-biases the transistor 911 such that it switches to a resistive state that permits current flow to ground voltage 927. Additionally, when not forward-biased, the diode 909 blocks the flow of RF signals 114 and 116 between nodes 905 and 907. Accordingly, the RF signals 114, 116 are shunted through the resistors 917, 913, 919 and the transistor 911 to ground 927, and not communicated between the nodes 905 and 907 via the diode 909. The resistors 935 and 941 and inductors, 933 and 939 form a direct-current voltage (VDS) bias path for the diode 909, wherein the resistors can be current limiting in the range of about 200 ohms or greater, and the inductors can be RF chokes in the range of about 4.7 microhenries (µH) or greater. As such, resistors 935 and 941 and inductors, 933 and 939 isolate the signal path between nodes 905 and 907 from the voltage source V and the ground 927.

Figure 9B:
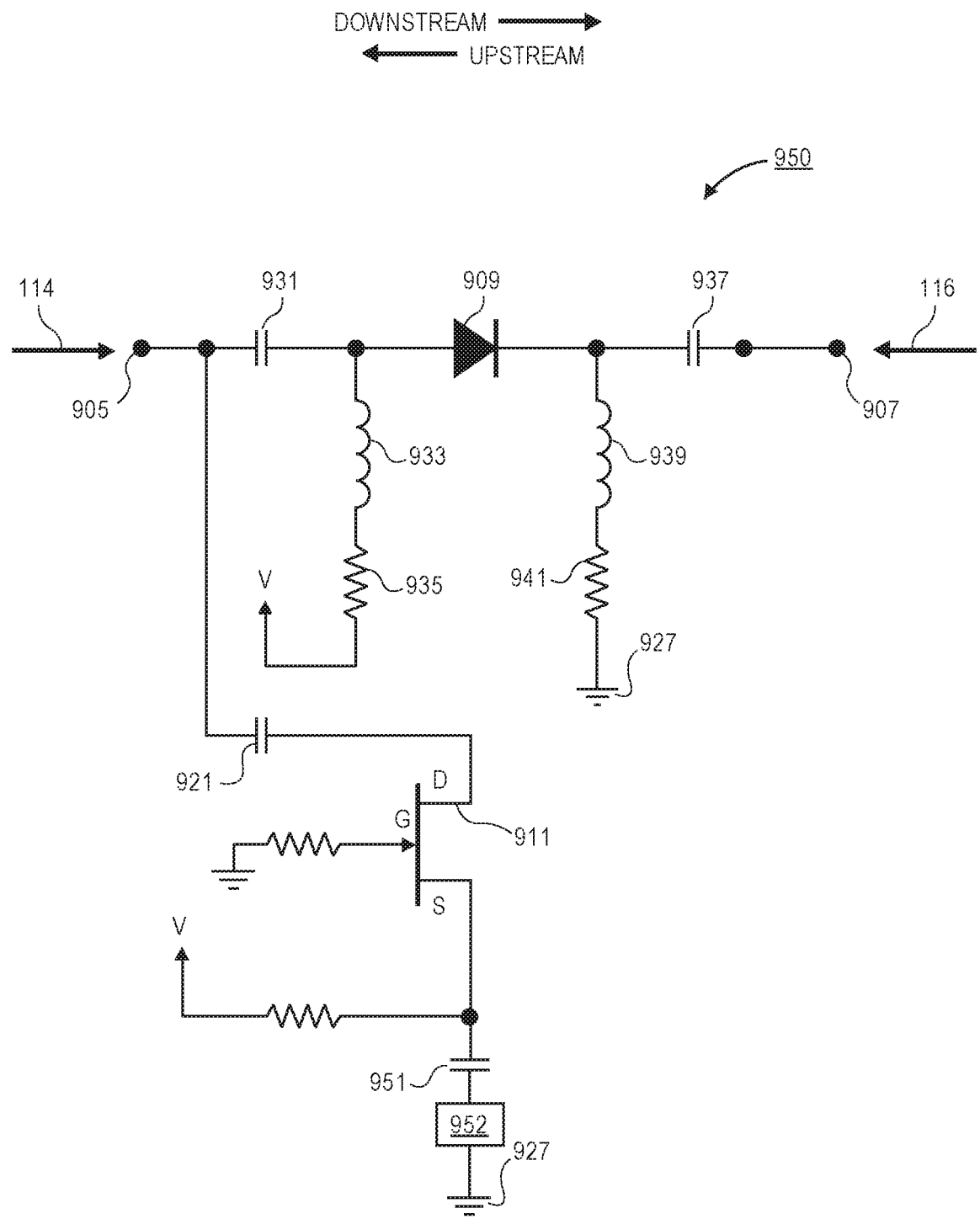
FIG. 9B is a functional block diagram of an example of a shunt buffer in accordance with aspects of the present disclosure.
Figure 9C:
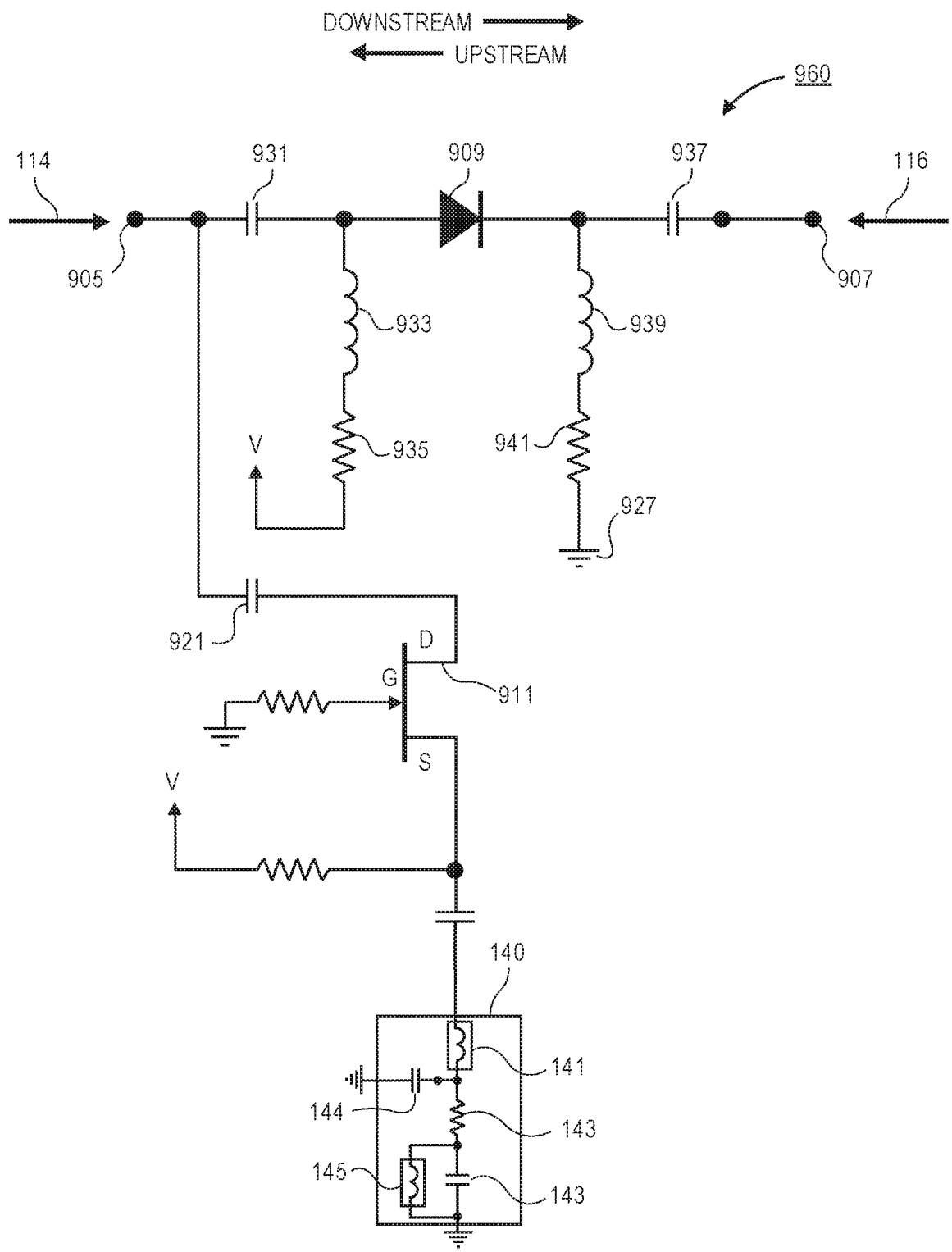
FIG. 9C is a functional block diagram of an example of a series buffer with a simplified absorptive band-pass filter in accordance with aspects of the present disclosure.

FIG. 9B is a functional block diagram of an example of a shunt buffer 950 in accordance with aspects of the present disclosure. The shunt buffer 950 may be similar to the buffer 826 in FIG. 9A. However, in the shunt buffer 950, the resistor 913 (and the line in which it is positioned), the resistor 917, the resistor 919 (and the line in which it is positioned), and/or the capacitor 923 (and the line in which it is positioned) may be omitted. In addition, a circuit element 952 may be connected to the capacitor 951 (e.g., positioned between the capacitor 951 and ground). The circuit element 952 may be or include an attenuator, a resistor, an absorptive ferrite, an absorptive low-pass filter, an absorptive band-pass filter, an absorptive high-pass filter, a phase-cancellation circuit, or a combination thereof. Examples of the circuit element 952 may be seen in FIGS. 3A, 3B, and 4-6.

FIG. 9C is a functional block diagram of an example of a series buffer 960 with a simplified absorptive band-pass filter in accordance with aspects of the present disclosure. The series buffer 960 may be similar to the series buffer 140 shown in FIG. 2A. In a first (e.g., normal) condition, the pin diode 909 may be closed, and signals pass in and out. In the first (e.g., normal) condition, the transistor (e.g., FET) 911 may be open, and the signal may be isolated from ground. In a second (e.g., error or power off) condition, the pin diode 909 may be open, and signals may be blocked in and out. In the second (e.g., error or power off) condition, the transistor (e.g., FET) 911 may be closed, and the signal may be absorbed in the absorptive band-pass filter. In a power-off condition, the transistor (e.g., FET) 911 may be or include a small resistance, and signal may be absorbed in the absorptive band-pass filter.

In FIGS. 9B and 9C, the diode 909 and the transistor (e.g., FET) 911 may form a single pole, double throw (SPDT) with the input as the common and the output and ground as the two outputs.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims. The present disclosure is not to be limited in terms of the particular embodiments described in this application, which are intended as illustrations of various aspects. Many modifications and variations can be made without departing from its spirit and scope, as will be apparent to those skilled in the art. Functionally equivalent apparatuses within the scope of the disclosure, in addition to those enumerated herein will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." In addition, where features or aspects of the disclosure are described in terms of Markush groups, those skilled in the art will recognize that the disclosure is also thereby described in terms of any individual member or subgroup of members of the Markush group.

What we claim is:

1. A network interface device, comprising:
   a power supply;
   an entry port configured to connect the network interface device to a radio-frequency (RF) signal source;
   a passive port configured to connect the network interface device to a first client device;
   an active port configured to connect the network interface device to a second client device;
   a passive RF signal path coupling the entry port to the passive port;
   an active RF signal path coupling the entry port to the active port and comprising a first relay, a buffer, and a second relay;
   a splitter/combiner device configured to split a downstream RF signal received by the entry port from the RF signal source between the active RF signal path and the passive RF signal path; and
   an amplifier circuit configured to amplify the downstream RF signal;
   wherein the first relay and the second relay, when energized by the power supply, are configured to direct an upstream RF signal received by the active port and the downstream RF signal to bypass the buffer;
   wherein the first relay and the second relay, when not energized by the power supply, are configured to direct the upstream RF signal and the downstream RF signal through the buffer; and
   wherein the active port is configured to provide the upstream RF signal through the amplifier circuit and the buffer to the entry port.

2. The network interface device of claim 1, wherein:
   the active RF signal path includes at least one active device; and
   the passive RF signal path lacks any active devices.

3. The network interface device of claim 1, wherein a common terminal of the splitter/combiner device is configured to receive the downstream RF signal as an input from the RF signal source via the entry port.

4. The network interface device of claim 1, wherein a first leg of the splitter/combiner device is configured to provide the downstream RF signal as an input to a common terminal of the first relay.

5. The network interface device of claim 4, wherein a second leg of the splitter/combiner device is configured to output the downstream RF signal to the passive port.

6. The network interface device of claim 1, wherein:
   a normally-open terminal of the first relay is configured to provide the downstream RF signal as an input to the buffer; and
   a normally-open terminal of the second relay is configured to provide the upstream RF signal as an input to the buffer.

7. The network interface device of claim 1, wherein:
   a normally-closed terminal of the first relay is configured to provide the downstream RF signal to a normally-closed terminal of the second relay; and
   a normally-closed terminal of the second relay is configured to provide the upstream RF signal to a normally-closed terminal of the first relay.

8. The network interface device of claim 1, wherein a common terminal of the second relay is configured to output the downstream RF signal to the active port through the amplifier circuit.

9. A network interface device, comprising:
an entry port configured communicate a downstream radio-frequency (RF) signal received from a signal source to an active path of the network interface device and to a passive path of the network interface device;
a first port configured to communicate a first upstream RF signal to the entry port via the passive path;
a second port configured to communicate a second upstream RF signal to the entry port via the active path; and
a buffer having a first state and a second state, the buffer being configured to:
in the first state, pass the second upstream RF signal and the downstream RF signal between the entry port and the second port via the active path, and
in the second state, prevent passage of the second upstream RF signal and the downstream RF signal between the entry port and the second port by absorbing, attenuating, terminating, or isolating the second upstream RF signal and the downstream RF signal by at least 10 decibels.

10. The network interface device of claim 9, further comprising a splitter/combiner device configured to:
divide the downstream RF signal between the active path and the passive path, and
combine the first upstream RF signal from the passive path with the second upstream RF signal from the active path.

11. The network interface device of claim 9, further comprising an amplifier circuit in the active path configured to amplify the downstream RF signal.

12. The network interface device of claim 11, wherein the amplifier circuit is further configured to amplify the first upstream RF signal, the second upstream RF signal, or both.

13. The network interface device of claim 11, wherein, in the second state, the buffer is configured to absorb, attenuate, terminate, or isolate RF signals reflected by the amplifier circuit.

14. The network interface device of claim 13, wherein the buffer is configured to absorb, attenuate, terminate, or isolate the RF signals reflected by the amplifier circuit by at least 10 decibels.

15. The network interface device of claim 9, wherein:
the buffer is configured to be in the first state during powered operation of the network interface device; and
the buffer is configured to be in the second state during unpowered operation of the network interface device.

16. The network interface device of claim 9, wherein the passive path lacks any active devices.

17. The network interface device of claim 9, wherein:
the buffer comprises a first relay, an attenuator, and a second relay;
in the first state, the first and second relays are configured to direct the second upstream RF signal and the downstream RF signal to bypass the attenuator;
in the second state, the first and second relays are configured to direct the second upstream RF signal and the downstream RF signal though the attenuator; and
the attenuator is configured to absorb, attenuate, terminate, or isolate the downstream RF signal, reflected downstream signals, and the second upstream RF signal.

18. The network interface device of claim 9, wherein the buffer comprises:
a diode configured to:
in the first state, communicate the downstream RF signal and the second upstream RF signal between the input port and the second port, and
in the second state, block communication of the downstream RF signal and the second upstream RF signal between the input port and the second port; and
a circuit configured to, in the second state, absorb, attenuate, terminate, or isolate the downstream RF signal, reflected downstream signals, and the second upstream RF signal.

19. A network interface device, comprising:
an active path between an entry port and a first input/output port;
a passive path between the entry port and a second input/output port;
a buffer in the active path configured to absorb, attenuate, terminate, or isolate radio-frequency (RF) signals; and
a switching element in the active path configured to cause the RF signals to:
selectively bypass the buffer during normal operating conditions, wherein the normal operating conditions comprise a first state that exists during powered operation of the network interface device, and
pass through the buffer during abnormal operating conditions, wherein the abnormal operating conditions comprise a second state that exists during non-powered operation or faulted operation of the network interface device.

20. The network device of claim 19, wherein the buffer is configured to block signal interference in the passive path from the active path during the non-powered operation or faulted operation of the network interface device.

21. The network interface device of claim 19, wherein:
the active path includes at least one active device; and
the passive path lacks any active devices.

22. The network interface device of claim 21, wherein the at least one active device comprises an amplifier circuit in the active path configured to amplify a downstream RF signal.

23. The network interface device of claim 22, wherein the amplifier circuit is further configured to amplify an upstream RF signal.

24. The network interface device of claim 19, further comprising a splitter/combiner device configured to:
divide a downstream RF signal received from the entry port between the active path and the passive path, and
combine a first upstream RF signal received from the passive path with a second upstream RF signal received from the active path.

25. The network interface device of claim 19, wherein the buffer comprises a series buffer, wherein the switching element comprises a first relay and a second relay, and wherein:
in the first state, the first relay and the second relay are configured to direct an upstream RF signal and a downstream RF signal to bypass the buffer;
in the second state, the first relay and the second relay are configured to direct the upstream RF signal and the downstream RF signal though the buffer; and
the buffer is configured to absorb, attenuate, terminate, or isolate the downstream RF signal, reflected downstream signals, and the upstream RF signal.

26. The network interface device of claim 19, wherein the buffer comprises a shunt buffer, wherein the switching element comprises a single relay, and wherein:
- in the first state, the single relay is configured to direct an upstream RF signal and a downstream RF signal to bypass the buffer;
- in the second state, the single relay is configured to direct the upstream RF signal and the downstream RF signal though the buffer; and
- the buffer is configured to absorb, attenuate, terminate, or isolate the downstream RF signal, reflected downstream signals, and the upstream RF signal.

27. The network interface device of claim 19, wherein the buffer comprises a shunt buffer, wherein the switching element comprises a first relay and a second relay, and wherein:
- in the first state, the first relay and the second relay are configured to direct an upstream RF signal and a downstream RF signal to bypass the buffer;
- in the second state, the first relay and the second relay are configured to direct the upstream RF signal and the downstream RF signal though the buffer; and
- the buffer is configured to absorb, attenuate, terminate, or isolate the downstream RF signal, reflected downstream signals, and the upstream RF signal.

28. The network interface device of claim 19, wherein the buffer comprises:
- a diode configured to:
  - in the first state, communicate a downstream RF signal and an upstream RF signal between the input port and the active port, and
  - in the second state, block communication of the downstream RF signal in the active path and the upstream RF signal between the input port and the active port; and
- a circuit configured to, in the second state, absorb, attenuate, terminate, or isolate the downstream RF signal, reflected downstream signals, and the upstream RF signal.

29. A network interface device, comprising:
- an entry port configured communicate a downstream radio-frequency (RF) signal received from a signal source to an active path of the network interface device and to a passive path of the network interface device;
- a first port configured to communicate a first upstream RF signal to the entry port via the passive path;
- a second port configured to communicate a second upstream RF signal to the entry port via the active path; and
- a buffer comprising a first relay, an attenuator, and a second relay,
- wherein, when the buffer is in a first state, the first and second relays are configured to direct the downstream RF signal and the second upstream RF signal to bypass the attenuator, allowing the downstream RF signal and the second upstream RF signal and to pass between the entry port and the second port via the active path, and
- wherein, when the buffer is in a second state, the first and second relays are configured to direct the downstream RF signal and the second upstream RF signal to the attenuator, which is configured to absorb, attenuate, terminate, or isolate the downstream RF signal and the second upstream RF signal, thereby substantially preventing passage of the downstream RF signal and the second upstream RF signal between the entry port and the second port.

30. A network interface device, comprising:
- an entry port configured communicate a downstream radio-frequency (RF) signal received from a signal source to an active path of the network interface device and to a passive path of the network interface device;
- a first port configured to communicate a first upstream RF signal to the entry port via the passive path;
- a second port configured to communicate a second upstream RF signal to the entry port via the active path; and
- a buffer comprising a diode,
- wherein, when the buffer is in a first state, the diode is configured to allow communication of the downstream RF signal and the second upstream RF signal between the entry port and the second port via the active path, and
- wherein, when the buffer is in a second state, the diode is configured to block communication of the downstream RF signal and the second upstream RF signal between the entry port and the second port.

* * * * *